United States Patent
Chen et al.

(10) Patent No.: US 7,481,312 B2
(45) Date of Patent: Jan. 27, 2009

(54) DIRECT COOLING PALLET ASSEMBLY FOR TEMPERATURE STABILITY FOR DEEP ION MILL ETCH PROCESS

(75) Inventors: Pei Chen, Campbell, CA (US); Jorge Goitia, San Jose, CA (US); Cherngye Hwang, San Jose, CA (US); Bigal Leung, Redwood City, CA (US); Diana Perez, San Jose, CA (US); Yongjian Sun, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 650 days.

(21) Appl. No.: 11/001,798

(22) Filed: Dec. 2, 2004

(65) Prior Publication Data

US 2006/0118447 A1 Jun. 8, 2006

(51) Int. Cl.
*B65D 85/00* (2006.01)
(52) U.S. Cl. .................. 206/386; 206/710; 118/724
(58) Field of Classification Search .................. 206/386, 206/701, 710, 711, 712, 722, 724, 527; 118/728, 118/500, 724, 59; 34/433, 508
See application file for complete search history.

(56) References Cited

U.S. PATENT DOCUMENTS

| | | | |
|---|---|---|---|
| 3,123,743 A * | 3/1964 | Perlmutter | 361/691 |
| 4,457,359 A | 7/1984 | Holden | |
| 4,508,161 A | 4/1985 | Holden | |
| 4,512,391 A | 4/1985 | Harra | |
| 4,564,585 A | 1/1986 | Blaske et al. | |
| 4,949,783 A | 8/1990 | Lakios et al. | |
| 5,001,548 A * | 3/1991 | Iversen | 257/714 |
| 5,022,462 A * | 6/1991 | Flint et al. | 165/80.4 |
| 5,177,878 A | 1/1993 | Visser | |
| 5,182,632 A * | 1/1993 | Bechtel et al. | 257/713 |
| 5,198,889 A * | 3/1993 | Hisano et al. | 257/678 |
| 5,744,400 A | 4/1998 | Dyer | |
| 5,745,983 A | 5/1998 | Quintana et al. | |
| 5,970,603 A | 10/1999 | Quintana et al. | |
| 6,007,635 A | 12/1999 | Mahawili | |
| 6,072,163 A | 6/2000 | Armstrong et al. | |
| 6,108,937 A | 8/2000 | Raaijmakers | |
| 6,198,601 B1 | 3/2001 | Hira et al. | |
| 6,388,861 B1 | 5/2002 | Frutiger | |
| 6,423,947 B2 | 7/2002 | Womack et al. | |
| 6,432,259 B1 | 8/2002 | Noorbakhsh et al. | |

(Continued)

FOREIGN PATENT DOCUMENTS

JP        10112448        4/1998

(Continued)

OTHER PUBLICATIONS

Bhardwaj et al. "High-Throughput Inductively coupled Plasma Production Platform for Etching Air-Bearing Surfaces on GMR Read/Write Heads" Datatech, Edition 1, pp. 131ff.

*Primary Examiner*—Jacob K Ackun, Jr.

(57) ABSTRACT

Embodiments of the present invention are directed to a frame component of a pallet assembly. In one embodiment, the frame comprises a plurality of arms for retaining at least one carrier component. The frame further comprises at least one spring disposed upon one of the plurality of arms. The spring for applying pressure upon the carrier.

6 Claims, 8 Drawing Sheets

U.S. PATENT DOCUMENTS

| | | |
|---|---|---|
| 6,442,026 B2 | 8/2002 | Yamaoka |
| 6,498,724 B1 | 12/2002 | Chien |
| 6,556,380 B2 | 4/2003 | Bunch et al. |
| 2003/0133227 A1 | 7/2003 | Anan et al. |

FOREIGN PATENT DOCUMENTS

| | | |
|---|---|---|
| JP | 2002372351 | 12/2002 |

* cited by examiner

DIRECT COOLING PALLET ASSEMBLY FOR TEMPERATURE STABILITY FOR DEEP ION MILL ETCH PROCESS

FIELD OF THE INVENTION

Embodiments of the present invention relate to the fabrication of magnetic storage devices. More specifically, embodiments of the present invention are directed to the removal of heat generated during the fabrication of magnetic storage devices.

BACKGROUND OF THE INVENTION

Etching processes are often used when shaping the components of magnetic storage devices such as the rails or other air bearing surfaces. An exemplary pallet assembly 100 used for shaping these components is shown in the exploded perspective view of FIG. 1. Pallet assembly 100 comprises a carrier 101 which holds a wafer or other component being etched. During use, a plurality of carriers 101 are slid between arms (e.g., 102a and 102b) of frame 102 which is then coupled with tray 103 using, for example, screws inserted into holes 104.

FIG. 2 shows a section view of pallet assembly 100. During use, a wafer 201 is coupled with carrier 101. As shown in FIG. 2, carrier 101 is held between arms 102a and 10b due to the dovetail configuration of the back side of carrier 101. Carrier 101 is in direct contact with tray 103 in region 203, thus facilitating heat dissipation from carrier 101 via conduction to tray 103. A plurality of fasteners (e.g., 210) couple tray 103 with frame 102. Often, to improve the thermal transfer characteristics of the pallet assembly, carrier 101 is thermally coupled with frame 102 using a thermally conductive epoxy. This heat is then conveyed to tray 103 via fasteners 210.

Pallet assemblies such as 101 can be used in the fabrication of components used in, for example, magnetic data storage devices. For example, a reactive ion etching (RIE) process or an ion milling process may be used to perform a shallow etch (e.g., approximately 0.18µ) of these components. However, when performing a deeper etch (e.g., approximately 1.32µ using an ion milling process) current pallet designs cannot dissipate the heat quickly enough. As a result, the carrier and/or wafer can get burned. Thus, conventional pallet assemblies are inadequate in removing heat during deep etch operations.

SUMMARY OF THE INVENTION

Embodiments of the present invention are directed to a frame component of a pallet assembly. In one embodiment, the frame comprises a plurality of arms for retaining at least one carrier component. The frame further comprises at least one spring disposed upon one of the plurality of arms. The spring for applying pressure upon the carrier.

Embodiments of the present invention are directed to a pallet assembly which facilitates direct cooling of the wafer carrier. In one embodiment, the pallet assembly comprises a frame which holds at least one carrier of a component. The pallet assembly further comprises a tray which is operable for being mechanically coupled with the frame. The tray comprises at least one discreet region which corresponds with the carrier when the tray is coupled with the frame. In embodiments of the present invention, the discreet region comprises at least one hole extending through the tray for permitting a coolant medium to dissipate heat from the carrier.

In one embodiment, a chamber, which corresponds with the discreet region, is defined by a gasket coupled with the tray, the carrier, and the tray. A plurality of holes extending through the tray permit a convective flow of the coolant medium into the chamber, thus facilitating the dissipation of heat from the carrier via convection.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

DETAILED DESCRIPTION OF THE PREFERRED EMBODIMENT

Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 1:
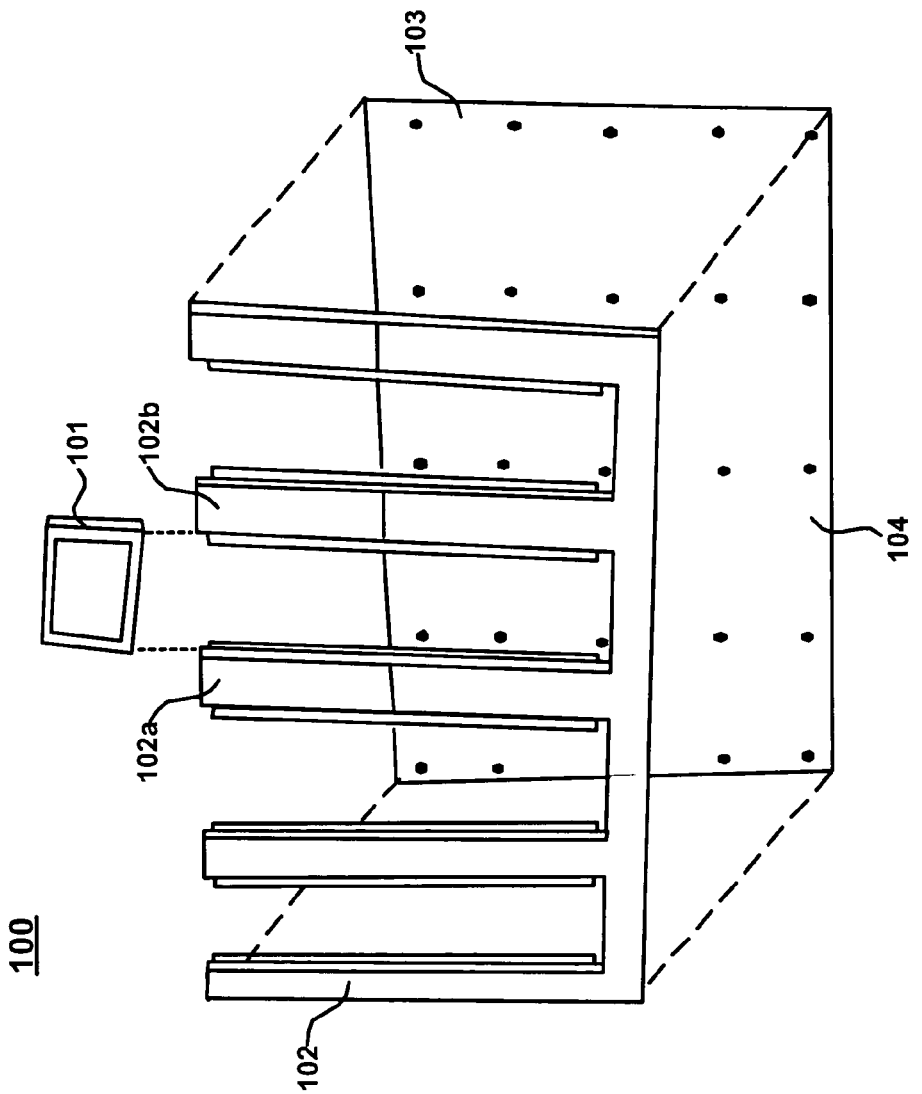
FIG. 1 is an exploded perspective view of an exemplary prior art pallet assembly.
Figure 2:
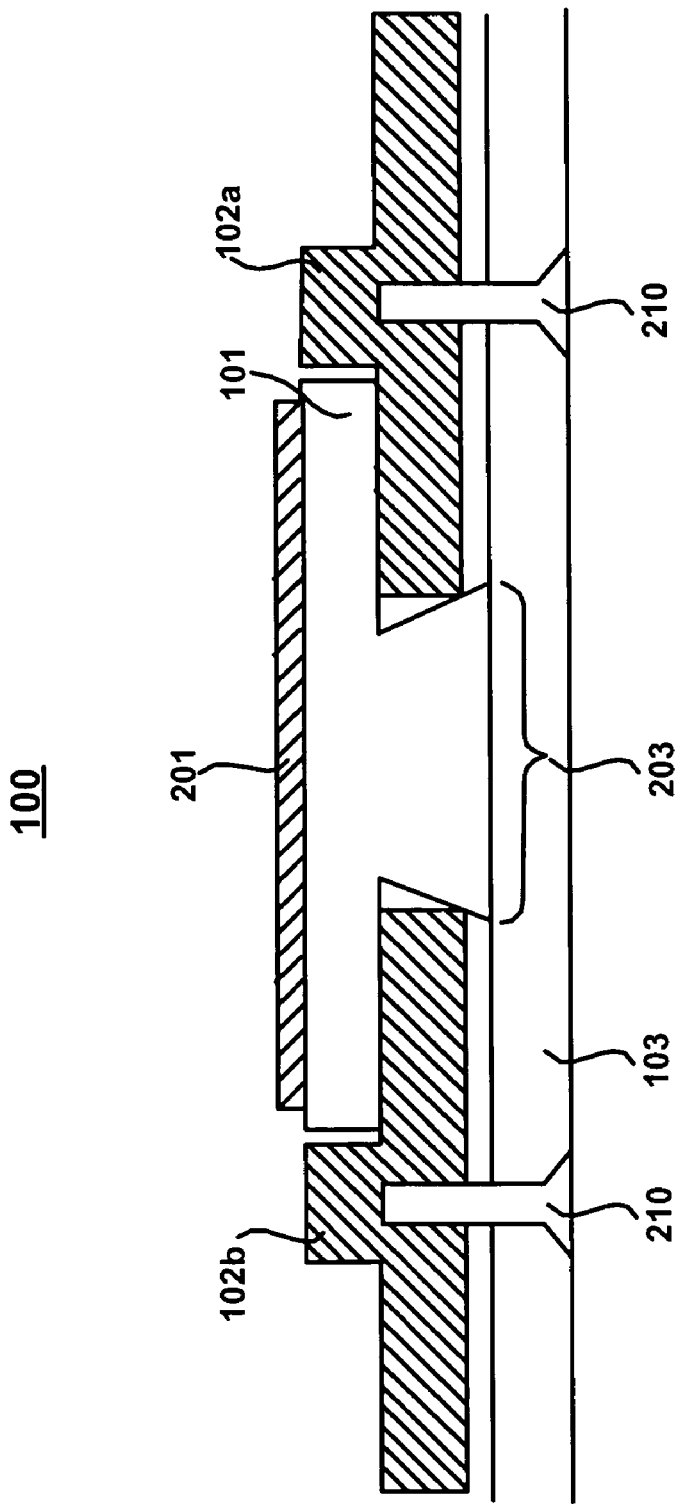
FIG. 2 is a cross section view of an exemplary prior art pallet assembly.
Figure 3:
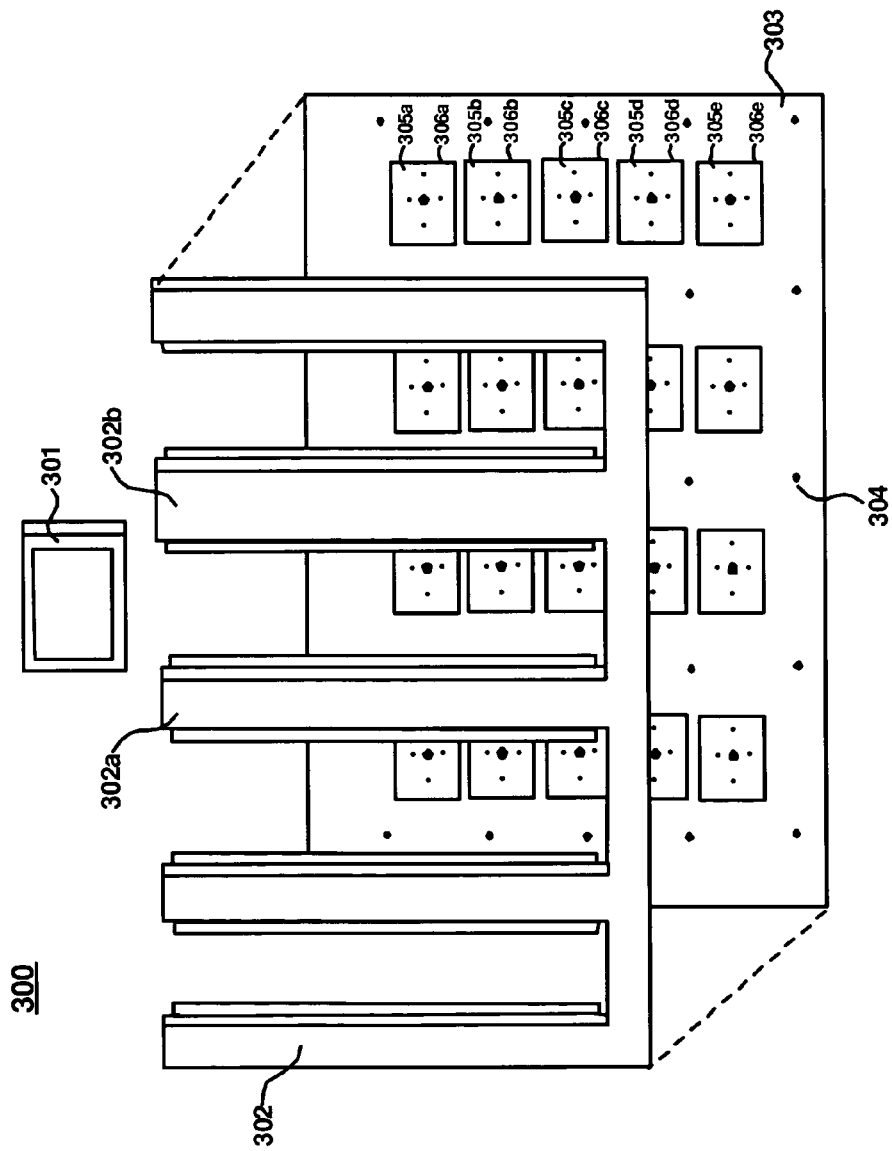
FIG. 3 is an exploded perspective view of an exemplary pallet assembly in accordance with embodiments of the present invention.

FIG. 3 is an exploded perspective view of an exemplary pallet assembly 300 in accordance with embodiments of the present invention. In FIG. 3, a carrier 301 which holds a wafer or other component being etched. Typically, a plurality of carriers 301 are slid between arms (e.g., 302a and 302b) of frame 302 which is then coupled with tray 303 using, for example, screws inserted into holes 304.

Tray 303 further comprises a plurality of discreet regions (e.g., 305a-305e) which correspond with a respective carrier 301 when tray 303 is coupled with frame 302. For purposes of clarity, the side of tray 303 shown in FIG. 3 upon which the discreet regions are disposed will be referred to as the "front side." In the embodiment of FIG. 3, each of the discreet regions 305a-305e is defined by a gasket (e.g., 306a-306e) which surrounds the corresponding discreet area. Furthermore, each of the discreet regions 305a-305e comprises at least one hole extending through tray 303. In embodiments of the present invention, holes 307a-307e are for permitting a coolant medium to pass through tray 303 and dissipate heat from carrier 301. In embodiments of the present invention, a convective flow of the coolant medium permits direct cooling of carrier 302.

Figure 4:
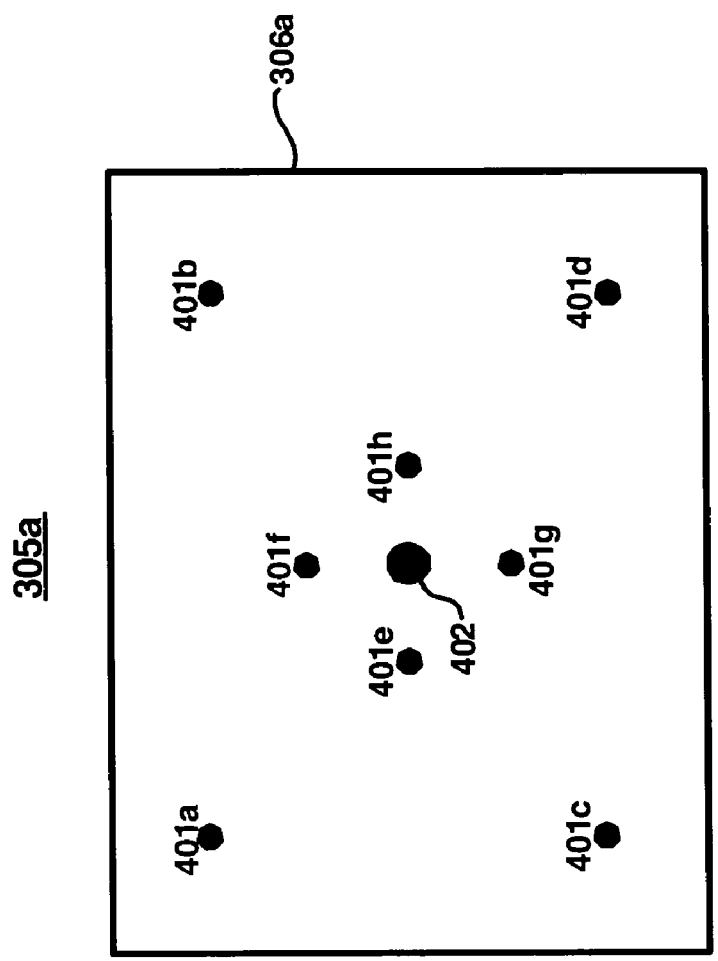
FIG. 4 is a front view of a discreet region of an exemplary pallet tray in accordance with embodiments of the present invention.

FIG. 4 is a front view of an exemplary discreet region 305a of a pallet tray in accordance with embodiments of the present invention. In embodiments of the present invention, discreet region 305a comprises a plurality of holes (e.g., 401a-410h) which extend through the pallet tray (e.g., 303). Gasket 306a defines the perimeter of discreet region 305a. Discreet region 305a further comprises a chamber maintaining device 402 which, in the embodiment of FIG. 4, is disposed in the center of discreet region 305a. In embodiments of the present invention, when frame 302 is coupled with tray 303, a chamber, corresponding to a given discreet region, is created behind each of the carriers in the frame. In embodiments of the present invention, the chamber is defined by the back side of carrier 301, the front side of tray 303, and along the inner edges of a corresponding gasket (e.g., 306a). A coolant medium can enter the chamber (e.g., via holes 401a-401h) to dissipate heat from the back side of carrier 302. Chamber maintaining device 402 is for preventing carrier 301 from compressing gasket 306a such that the flow of a cooling medium would be impeded when frame 302 is coupled with tray 303. In embodiments of the present invention, chamber maintaining device 402 comprises a heat resistant material such as heat resistant tape. While FIG. 4 shows one chamber maintaining device 402 embodiments of the present invention are well suited for using a plurality of these devices disposed in various locations of discreet region 305a. Furthermore, while FIG. 4 shows discreet region 305a comprising eight holes, it is appreciated that in embodiments of the present invention the number of holes in the discreet region may be one or more holes.

Figure 5:
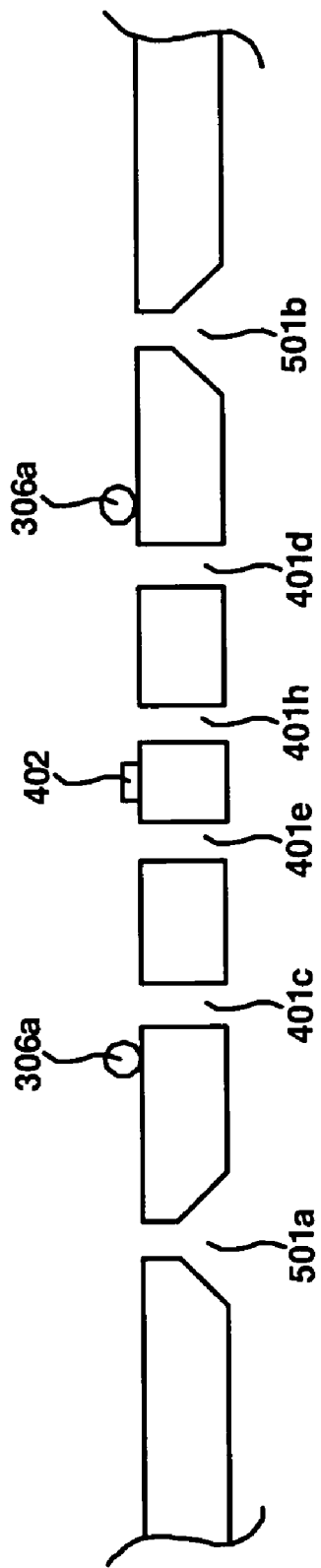
FIG. 5 is a section view of an exemplary pallet tray in accordance with embodiments of the present invention.

FIG. 5 is a section view of an exemplary pallet tray 303 in accordance with embodiments of the present invention. As shown in FIG. 5, tray 303 has not been coupled with frame 302. Holes 501a and 501b are screw holes for mechanically coupling tray 303 with frame 302. While the present embodiment recites mechanically coupling tray 303 with frame 302, other methods (e.g., a thermally conductive epoxy) may be used as well. Furthermore, gasket 306a is shown in an uncompressed state prior to coupling with frame 302. Holes 401c, 401e, 401h, and 401d are also shown extending through tray 303. Chamber maintaining device 402 is again shown disposed in the center of discreet region 305a.

Figure 6:
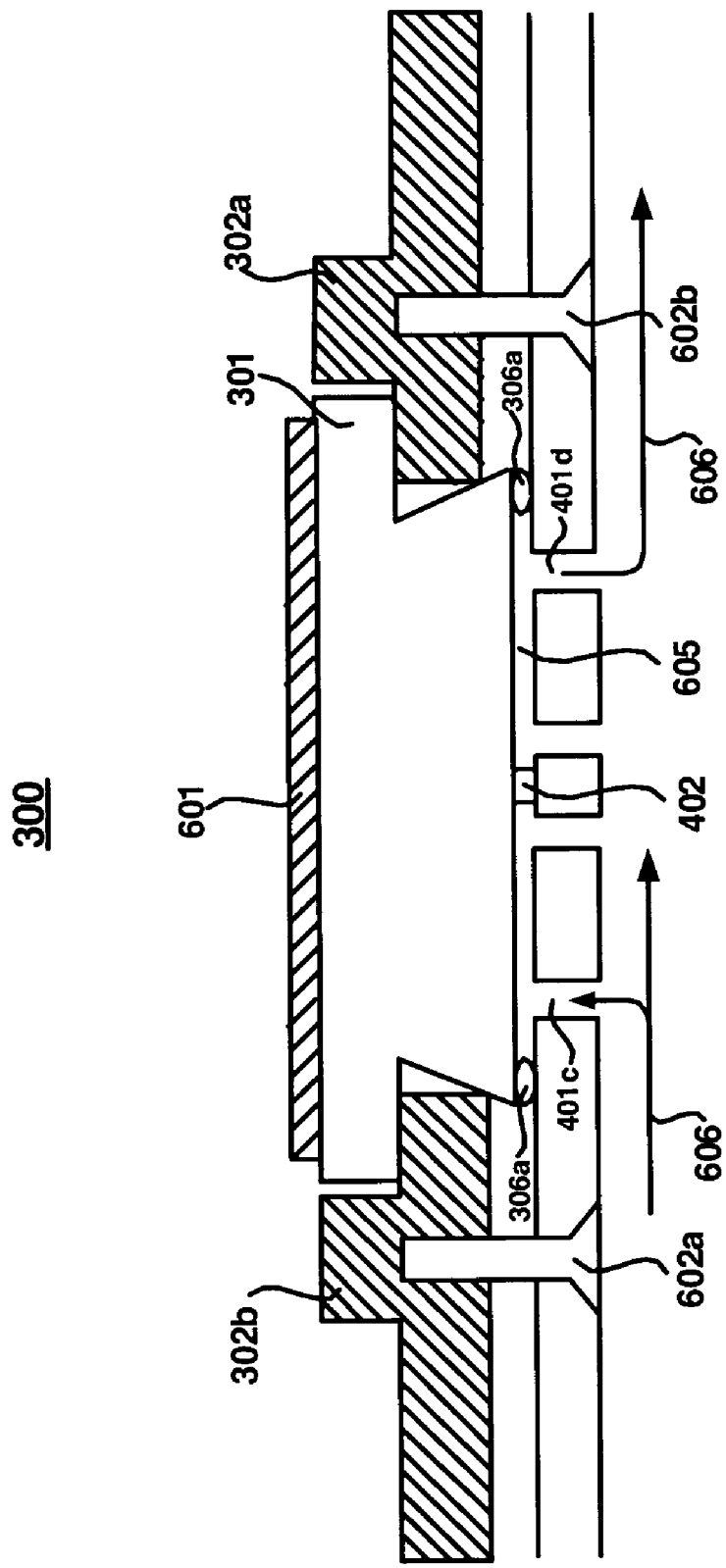
FIG. 6 is a section view of an exemplary pallet assembly in accordance with embodiments of the present invention.

FIG. 6 is a section view of an exemplary pallet assembly in accordance with embodiments of the present invention. As shown in FIG. 6, frame 302 has been coupled with tray 303 using screws 601a and 601b. Carrier 301 is now disposed between arms 302a and 302b of frame 302. Furthermore, chamber maintaining device 402 now contacts the back side of carrier 301 to prevent further compression of gasket 306a. In so doing, chamber 605 is formed which allows a coolant medium 606 to enter chamber 605 (e.g., via hole 401c) and dissipate heat from carrier 301. As a result, carrier 301 is now directly cooled by coolant medium 606 rather than relying upon tray 303 to conduct the heat away. Coolant medium 606 can also exit chamber 605 (e.g., via hole 401d) and convey the heat away from pallet assembly 600. In one embodiment, coolant medium 606 is helium gas.

As a result, when fabricating component 601 (e.g., a magnetic head element) heat is conveyed to carrier 301 and is then dissipated by the convective flow of coolant medium 606 past carrier 301. Embodiments of the present invention are more efficient than conventional pallet assemblies in conveying heat away during the fabrication of component 601. As a result, a deep etch using, for example, the ion milling process can be achieved using embodiments of the present invention. Additionally, embodiments of the present invention are more efficient than conventional pallet assemblies in dissipating heat during other etch processes such as reactive ion etching.

Frame Component with Springs

Figure 7:
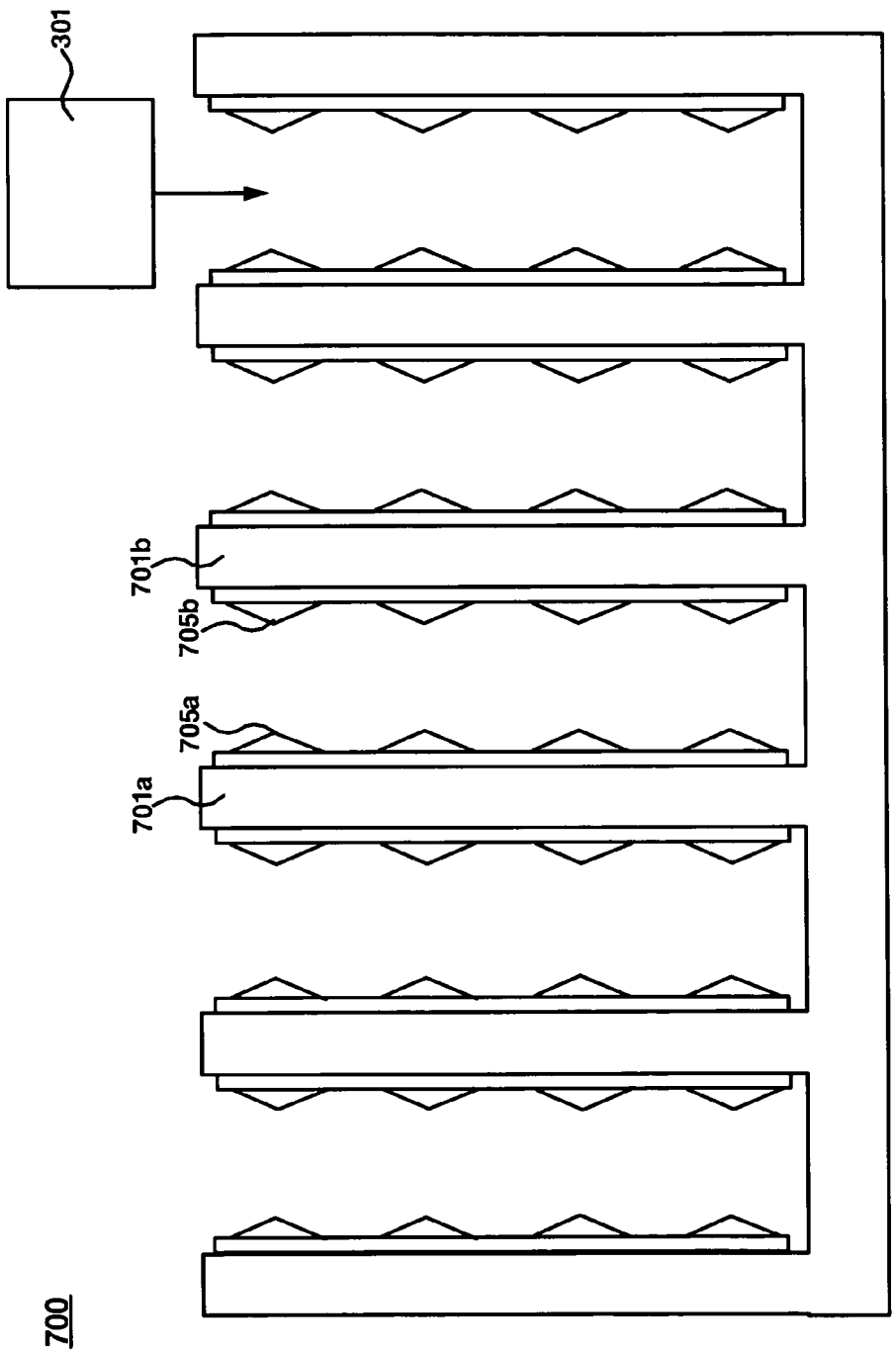
FIG. 7 shows a pallet frame used in accordance with embodiments of the present invention.

FIG. 7 shows a pallet frame 700 used in accordance with embodiments of the present invention. In the embodiment of FIG. 7, pallet frame 700 comprises a plurality of arms (e.g., 701a, 701b, etc.) for holding a carrier component (e.g., 301). Pallet frame 700 further comprises at least one spring (e.g., 705a and 705b) disposed on one of the arms for applying pressure upon the carrier component 301 when carrier component 301 is inserted between two of the pallet frame arms. As discussed above, a dovetail slot on the back side carrier component 301 facilitates keeping carrier component 301 between the arms of the pallet frame while the pallet assembly is being handled. However, the carrier components 301 can still slide out of the side of the pallet frame in the direction in which they were first inserted into the frame. Additionally, in embodiments of the present invention, the pressure applied by springs 705a and 705b upon carrier component 301 causes carrier component 301 to apply pressure downward onto the pallet tray. Thus, embodiments of the present invention are more effective than conventional pallet frames in causing the carrier component to contact the pallet tray. This is advantageous in pallet tray designs which are used to conduct heat away from the carrier component as well as pallet tray designs which create a chamber for allowing a convective flow to convey heat away from the carrier component. For example, using pallet frame 700 in conjunction with a conductive pallet tray causes carrier component (e.g., 301) to contact the pallet tray. As a result, the potential for a gap to form between carrier component 301 and the conductive pallet tray is reduced. This results in greater heat conduction from carrier component 301 to the conductive pallet tray.

Figure 8:
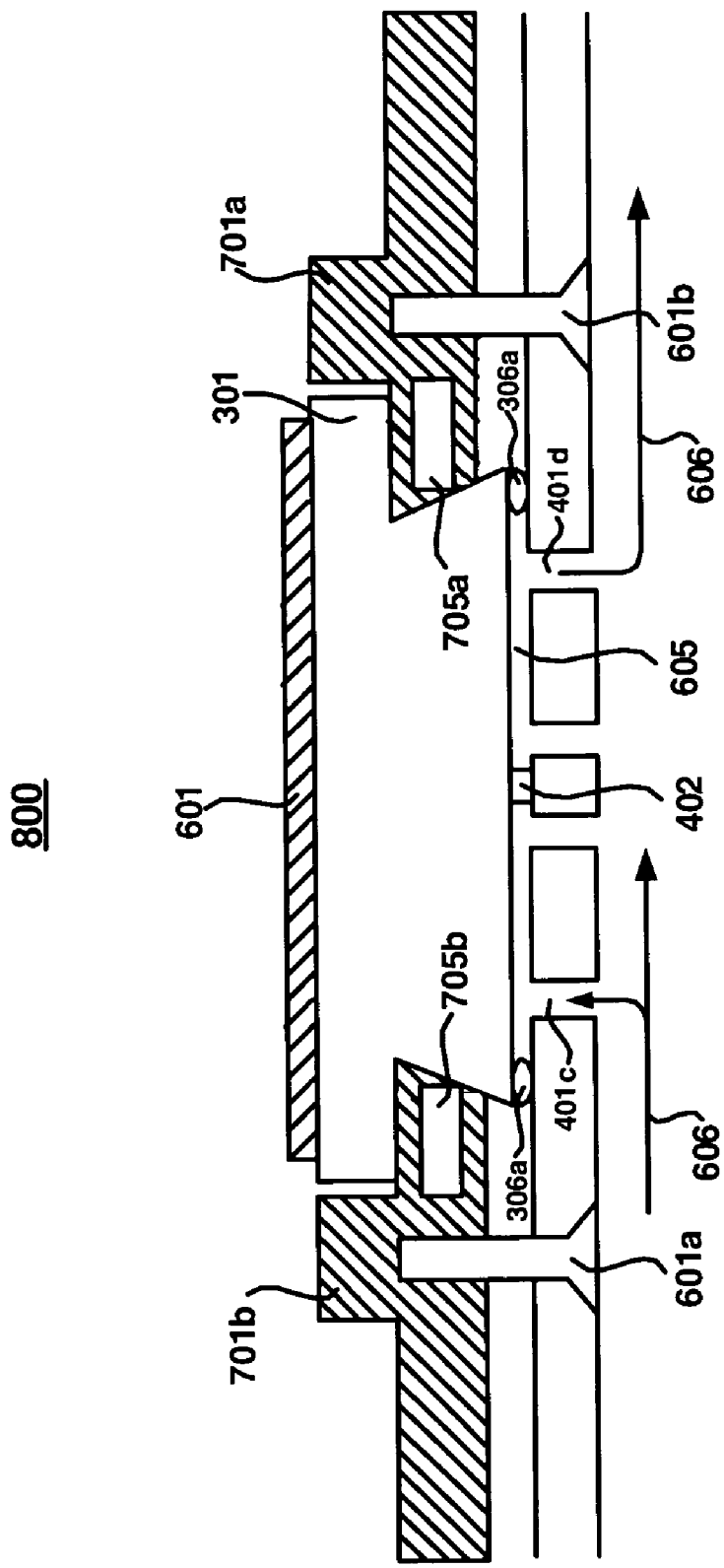
FIG. 8 is a section view of a pallet assembly in accordance with embodiments of the present invention.

FIG. 8 is a section view of a pallet assembly 800 in accordance with embodiments of the present invention. As shown in FIG. 8, pallet frame 700 has been coupled with the pallet tray 303 described above with reference to FIG. 3, FIG. 4, FIG. 5, and FIG. 6. As shown in FIG. 8, pallet frame 700 has been coupled with tray 303 using screws 601a and 601b. Carrier 301 is now disposed between arms 701a and 701b of pallet frame 700. Springs 705a and 705b exert a lateral force upon the sides of carrier component 301. However, due to the dovetail configuration of the backside of carrier component 301, the lateral force applied by springs 705a and 705b cause carrier component 301 to exert a downward force onto gasket 306a of pallet tray 303, thus compressing the gasket. Using pallet frame 700 in conjunction with pallet tray 303 is advantageous in that the downward force exerted by carrier component 301 helps to maintain a tighter seal along the periphery of gasket 306a, thereby preventing a loss of coolant medium 606.

As described above with reference to FIG. 6, chamber maintaining device 402 contacts the back side of carrier 301 and prevents compression of gasket 306a to such a degree that chamber 605 no longer exists. As describe above with reference to FIG. 6, coolant medium 606 enters chamber 605 (e.g., via hole 401*c*) and dissipates heat from carrier 301. As a result, carrier 301 is now directly cooled by coolant medium 606 rather than relying upon tray 303 to conduct the heat away. Coolant medium 606 can also exit chamber 605 (e.g., via hole 401*d*) and convey the heat away from pallet assembly 600.

The preferred embodiment of the present invention, direct cooling pallet assembly for temperature stability for deep ion mill etch process, is thus described. While the present invention has been described in particular embodiments, it should be appreciated that the present invention should not be construed as limited by such embodiments, but rather construed according to the following claims.

What is claimed is:

1. A pallet assembly comprising:
    a carrier for holding a wafer during a deep etching process for etching more than 1.0 microns of material from said wafer;
    a frame comprising at least one spring for holding at least one of said carriers, wherein said carrier and said frame form a chamber when coupled; and
    a tray operable for being mechanically coupled with said frame, said tray comprising at least one discreet region corresponding with said carrier when coupled with said frame, wherein said discreet region comprises at least one hole extending through said tray for permitting a coolant medium to enter said chamber and dissipate heat from said carrier.

2. The pallet assembly of claim 1 wherein said wafer comprises at least one magnetic head element.

3. The pallet assembly of claim 1 wherein said tray further comprises:
    a gasket for defining said discreet region and wherein said spring causes said carrier to apply pressure upon said gasket when said pallet tray is mechanically coupled with said frame.

4. The pallet assembly of claim 1 wherein said coolant medium comprises helium.

5. The pallet assembly of claim 1 wherein said discreet region comprises:
    a plurality of said holes extending through said tray.

6. The pallet assembly of claim 5 wherein said coolant medium is conveyed through said chamber via a convective flow past said carrier.

* * * * *